US009870988B2

(12) United States Patent
Cassidy et al.

(10) Patent No.: US 9,870,988 B2
(45) Date of Patent: Jan. 16, 2018

(54) METHOD OF PRODUCING A SEMICONDUCTOR DEVICE WITH THROUGH-SUBSTRATE VIA COVERED BY A SOLDER BALL

(71) Applicant: ams AG, Unterpremstaetten (AT)

(72) Inventors: Cathal Cassidy, Okinawa (JP); Martin Schrems, Eggersdorf (AT); Franz Schrank, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/691,654

(22) Filed: Aug. 30, 2017

(65) Prior Publication Data

US 2017/0365551 A1    Dec. 21, 2017

Related U.S. Application Data (62) Division of application No. 15/283,189, filed on Sep. 30, 2016, now Pat. No. 9,773,729, which is a division
(Continued)

(30) Foreign Application Priority Data

Nov. 23, 2011 (EP) .................................... 11190389

(51) Int. Cl.
*H01L 21/44* (2006.01)
*H01L 23/522* (2006.01)
(Continued)

(52) U.S. Cl.
CPC .... *H01L 23/5226* (2013.01); *H01L 21/76898* (2013.01); *H01L 23/481* (2013.01); *H01L 23/5283* (2013.01); *H01L 23/53295* (2013.01);

*H01L 24/05* (2013.01); *H01L 24/06* (2013.01); *H01L 24/11* (2013.01); *H01L 24/13* (2013.01); *H01L 24/14* (2013.01); *H01L 24/16* (2013.01);
(Continued)

(58) Field of Classification Search
CPC ............... H01L 23/5226; H01L 23/481; H01L 21/76898; H01L 24/14; H01L 24/06; H01L 23/5283; H01L 23/53295; H01L 24/05; H01L 24/11; H01L 24/13; H01L 24/16
USPC .................. 438/613, 615; 257/738, E23.021
See application file for complete search history.

(56) References Cited

U.S. PATENT DOCUMENTS 8,378,496 B2   2/2013 Schrank et al.
9,735,101 B2 *  8/2017 Cassidy ............. H01L 23/5226
(Continued)

FOREIGN PATENT DOCUMENTS

DE      102006040960 A1   12/2007
DE      102007034306 B3    4/2009
(Continued)

*Primary Examiner* — Thien F Tran
(74) *Attorney, Agent, or Firm* — McDermott Will & Energy LLP (57) ABSTRACT

A semiconductor substrate is provided with an annular cavity extending from a front side of the substrate to an opposite rear side. A metallization is applied in the annular cavity, thereby forming a through-substrate via and leaving an opening of the annular cavity at the front side. A solder ball is placed above the opening and a reflow of the solder ball is effected, thereby forming a void of the through-substrate via, the void being covered by the solder ball.

7 Claims, 5 Drawing Sheets

Related U.S. Application Data of application No. 14/359,568, filed as application No. PCT/EP2012/072060 on Nov. 7, 2012, now Pat. No. 9,553,039.

(51) Int. Cl.
| | | |
|---|---|---|
| *H01L 23/00* | (2006.01) | |
| *H01L 23/532* | (2006.01) | |
| *H01L 23/528* | (2006.01) | |
| *H01L 21/768* | (2006.01) | |
| *H01L 23/48* | (2006.01) | |
| *H01L 25/065* | (2006.01) | |
| *H01L 23/552* | (2006.01) | |

(52) U.S. Cl.
CPC ........ *H01L 23/552* (2013.01); *H01L 25/0657* (2013.01); *H01L 2224/02372* (2013.01); *H01L 2224/0401* (2013.01); *H01L 2224/05548* (2013.01); *H01L 2224/05569* (2013.01); *H01L 2224/05572* (2013.01); *H01L 2224/10125* (2013.01); *H01L 2224/11334* (2013.01); *H01L 2224/11849* (2013.01); *H01L 2224/131* (2013.01); *H01L 2224/136* (2013.01); *H01L 2224/1319* (2013.01); *H01L 2224/13025* (2013.01); *H01L 2224/13027* (2013.01); *H01L 2224/13028* (2013.01); *H01L 2224/1357* (2013.01); *H01L 2224/13561* (2013.01); *H01L 2224/1613* (2013.01); *H01L 2224/16106* (2013.01); *H01L 2224/16225* (2013.01); *H01L 2224/16227* (2013.01); *H01L 2924/00014* (2013.01); *H01L 2924/30101* (2013.01)

(56) References Cited

U.S. PATENT DOCUMENTS

| | | |
|---|---|---|
| 2001/0005046 A1 | 6/2001 | Hsuan et al. |
| 2009/0079021 A1 | 3/2009 | Vogtmeier et al. |
| 2009/0120679 A1 | 5/2009 | Andry et al. |
| 2009/0261457 A1 | 10/2009 | Pratt |
| 2010/0096738 A1 | 4/2010 | Simmons-Matthews et al. |
| 2010/0171209 A1 | 7/2010 | Tanie et al. |
| 2010/0276081 A1 | 11/2010 | Val |
| 2011/0074040 A1 | 3/2011 | Frank et al. |
| 2011/0143535 A1 | 6/2011 | Pares |
| 2011/0169169 A1 | 7/2011 | Reinmuth et al. |

FOREIGN PATENT DOCUMENTS

| | | |
|---|---|---|
| EP | 2337067 A2 | 6/2011 |
| JP | 2005285972 A | 10/2005 |
| KR | 20100051754 A | 5/2010 |
| KR | 20100065785 A | 6/2010 |
| WO | WO-2007110799 A2 | 10/2007 |
| WO | WO-2009/013315 A2 | 1/2009 |
| WO | WO-2011/056374 A2 | 5/2011 |

\* cited by examiner

METHOD OF PRODUCING A SEMICONDUCTOR DEVICE WITH THROUGH-SUBSTRATE VIA COVERED BY A SOLDER BALL

CROSS-REFERENCE TO RELATED APPLICATIONS

The present application is a divisional application of U.S. patent application Ser. No. 15/283,189 entitled "METHOD OF PRODUCING A SEMICONDUCTOR DEVICE WITH THROUGH-SUBSTRATE VIA COVERED BY A SOLDER BALL," filed on Sep. 30, 2016, which is a divisional application of U.S. patent application Ser. No. 14/359,568, filed on May 20, 2014, and issued as U.S. Pat. No. 9,553,039, which is the national stage of entry of International Patent Application No. PCT/EP2012/072060, filed on Nov. 7, 2012, which claims the benefit of priority under 35 U.S.C. §119 of European Patent Application No. 11190389.4 filed on Nov. 23, 2011, all of which are hereby incorporated by reference in their entirety for all purposes.

DESCRIPTION

The invention relates to a method of producing a semiconductor device having an unfilled through-substrate via or interconnect provided with a solder ball.

BACKGROUND OF THE INVENTION

In threedimensional integration of semiconductor devices, semiconductor substrates that are provided with structures of integrated circuits, like conductor tracks and electronic circuit components, are stacked and bonded. The conductors that are arranged on different substrates may be connected by through-substrate vias, which are interconnects leading through a substrate. In the case of a silicon substrate these vias are usually designated as through-silicon vias. The via hole in the substrate may be filled with the electrically conductive material or with electrically conductive material and an additional dielectric material.

WO 2009/013315 A2 describes a through-substrate via comprising an unfilled hole in the semiconductor substrate. A terminal contact area surrounds the recess of the via, and a solder ball is deposited so that it closes the recess. In this way a plurality of solder balls may be provided for electric connection, using only a small area of the substrate surface. The diameter of the recess is specified in the range from 50 µm to 500 µm. The solder ball can have a typical dimension of 300 µm to 400 µm side length or diameter.

WO 2011/056374 A2 describes a coaxial through-silicon via.

US 2010/0171209 A1 describes a chip stack comprising gold-plated through-silicon vias, which are interconnected by solder balls provided with a core of a higher melting point. The core, which is adapted to engage in a recess of the via hole, can be copper, tungsten, molybdenum, an insulator or a plastic material.

SUMMARY OF THE INVENTION

A semiconductor substrate is provided with an annular cavity extending from a front side of the substrate to an opposite rear side. Separate metallizations are applied on sidewalls of the annular cavity. A double through-substrate via is thus formed, leaving an opening of the annular cavity at the front side. A solder ball is placed above the opening, and a reflow of the solder ball is effected to form a void of the through-substrate via covered by the solder ball. An electrically conductive pad, which is electrically connected to one of the metallizations and arranged at the front side of the substrate on a pillar formed by a portion of the substrate that is surrounded by the annular cavity, may be electrically contacted by the solder ball.

The following is a detailed description of examples of the method of production in conjunction with the accompanying drawings.

DETAILED DESCRIPTION

Figure 1:
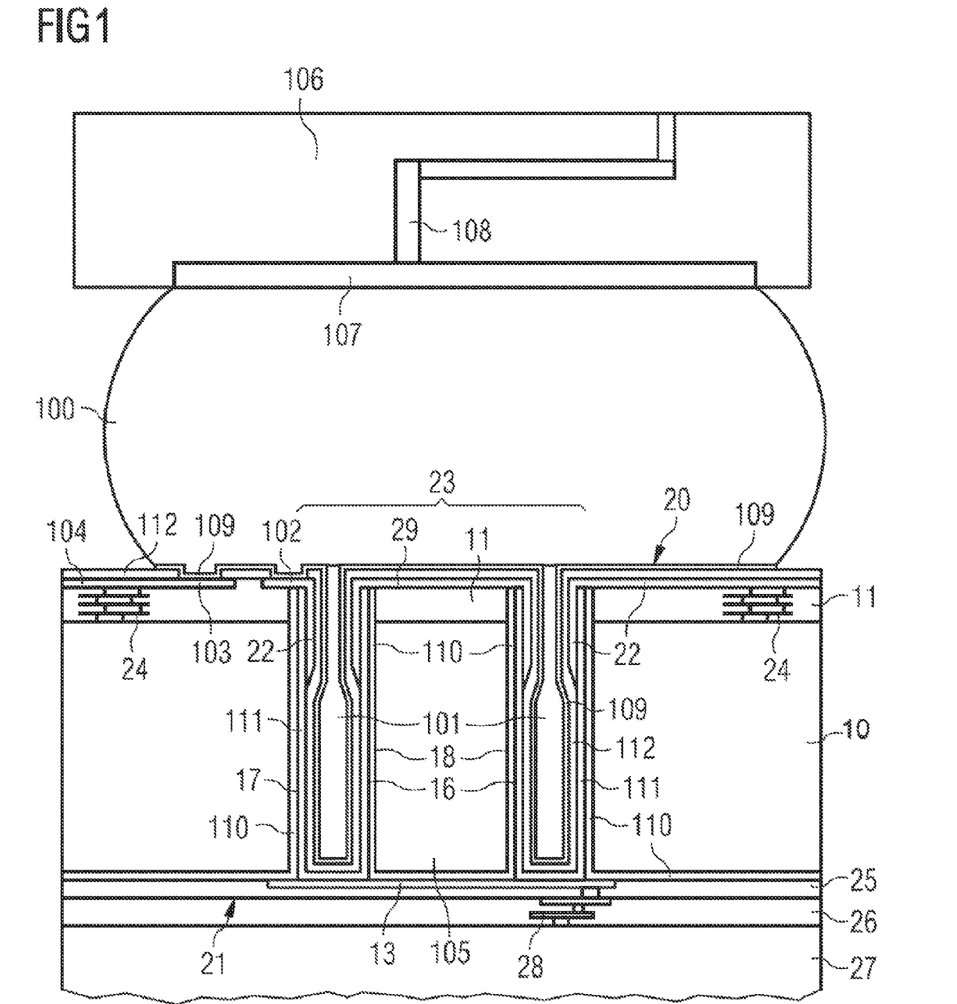
FIG. 1 shows a cross-section of a semiconductor device comprising an annular cavity.

FIG. 1 shows a cross-section of a semiconductor device in a threedimensionally integrated arrangement. The semiconductor device comprises a semiconductor substrate 10 with an intermetal dielectric 11 at the front side 20. A circuitry may be arranged at the front side 20 and may include active circuit components and a wiring 24 that is embedded in the intermetal dielectric 11. The circuitry can be a CMOS circuit or an ASIC, for example.

A through-substrate via 23 is formed in the substrate 10 by means of a metallization 111, which is arranged at a sidewall of the through-substrate via 23 and is connected with an upper terminal layer 22 and with a rear terminal layer 13 located opposite to the front side 20 at a rear side 21 of the substrate 10. The upper terminal layer 22 may be formed integrally with the metallization 111, or it may be a separate top metallization, which is separately applied so that it is in electrical contact with the metallization 111. The latter case is indicated by way of example in the layer structure shown in FIG. 1.

The rear terminal layer 13 may be arranged in a dielectric 25 at the rear side 21 of the substrate 10. The dielectric 25 may be an oxide of the semiconductor material, for instance. At the rear side 21 of the substrate 10, a further circuitry or device structure may be disposed in a further layer structure of the substrate 10 or on a further substrate 27 that is connected to the rear side 21 of the substrate 10. The further circuitry or device structure may comprise a sensor, for instance. The further substrate 27 may comprise a further wiring 28 in a further intermetal dielectric 26. The rear terminal layer 13 may be connected to the wiring 28, as shown in FIG. 1. The further substrate 27 may comprise any circuitry or device structure, which is therefore not shown in detail.

The through-substrate via 23 is not filled with solid material, and a void 101, which may be filled with air or another gas, is left in the via. The via metallization 111 may be insulated from the substrate 10 by an insulator 110, which is applied at least on the sidewall of the via. The insulator 110 may be an oxide of the semiconductor material. A passivation layer 112 may be applied on the via metallization 111.

A solder ball 100 is arranged on the through-substrate via 23 and closes the void 101. In this example a via pad 102 is located in the upper terminal layer 22. The passivation layer 112 is provided with an opening above the via pad 102, and the solder ball 100 is applied on the via pad 102 in such a manner that it makes an electrical contact with the via pad 102. A metal pad 103 is present in an upper metal layer 104, which is separate from the upper terminal layer 22. The upper terminal layer 22 and the upper metal layer 104 may be insulated from one another by the intermetal dielectric 11. The solder ball 100 electrically contacts the metal pad 103 and thus connects the via pad 102 electrically to the metal pad 103. In this fashion an electrical connection is provided between the wiring 24 and the rear terminal layer 13. The electrical contacts of the solder ball 100 may be effected by means of an under-bump metallization 109, which may be applied above the passivation layer 112.

The solder ball 100 may be used for a threedimensional integration with a further substrate 106, which comprises a contact island 107 formed as a metal layer. The further substrate 106 is arranged above the front side 20 of the substrate 10 so that the contact island 107 faces the through-substrate via 23. The substrate 10 and the further substrate 106 may be arranged at a distance of typically about 230 μm, for example. The solder ball 100 electrically contacts the contact island 107, which may be the terminal of a further via 108 of the further substrate 106 or the terminal of a further wiring, for example. In the device according to FIG. 1 the solder ball 100 thus forms electrical connections between the upper terminal layer 22, the metal pad 103 and the contact island 107 of the further substrate 106.

The arrangement according to FIG. 1 can be produced by placing a solder ball on the opening of the through-substrate via 23 and effecting a reflow of the solder ball by increasing the temperature. After the reflow the solder ball 100 has the lenticular shape shown in FIG. 1, electrically contacts the pads 102, 103, and closes the void 101 without filling it. Capillary forces that might draw the solder ball into the opening of the through-substrate via 23 are counteracted by air that is trapped in the void 101. Therefore the solder ball 100 is kept out of the void 101 except for a small lower bulge, at most.

The use of a solder ball 100 which simultaneously caps the through-substrate via 23 and makes one or more electrical contacts permits a variable arrangement of interconnects between the circuitries of the substrates 10, 106. With the solder ball 100 placed above an opening of the via, the substrate area is used economically, and a great number of solder balls 100, typically over a hundred, can easily be arranged above the surface of the substrate 10.

In the device according to FIG. 1, the through-substrate via 23 has an annular cavity 18. The via metallization 111, which is connected with the upper terminal layer 22 and the rear terminal layer 13 located at the rear side 21 of the substrate 10, is applied to an inner sidewall 16 and to an outer sidewall 17 of the annular cavity 18. The annular cavity 18 may have the shape of a cylinder barrel, and the inner sidewall 16 and the outer sidewall 17 may be coaxial cylindrical surfaces. If the outer sidewall 17 of the through-substrate via 23 is cylindrical and has a diameter of typically about 100 μm, the lateral dimension of the solder ball 100 may be typically about 280 μm. The portion of the substrate 10 that is surrounded by the annular cavity 18 forms a kind of pillar 105, which serves to support the solder ball 100.

Figure 2:
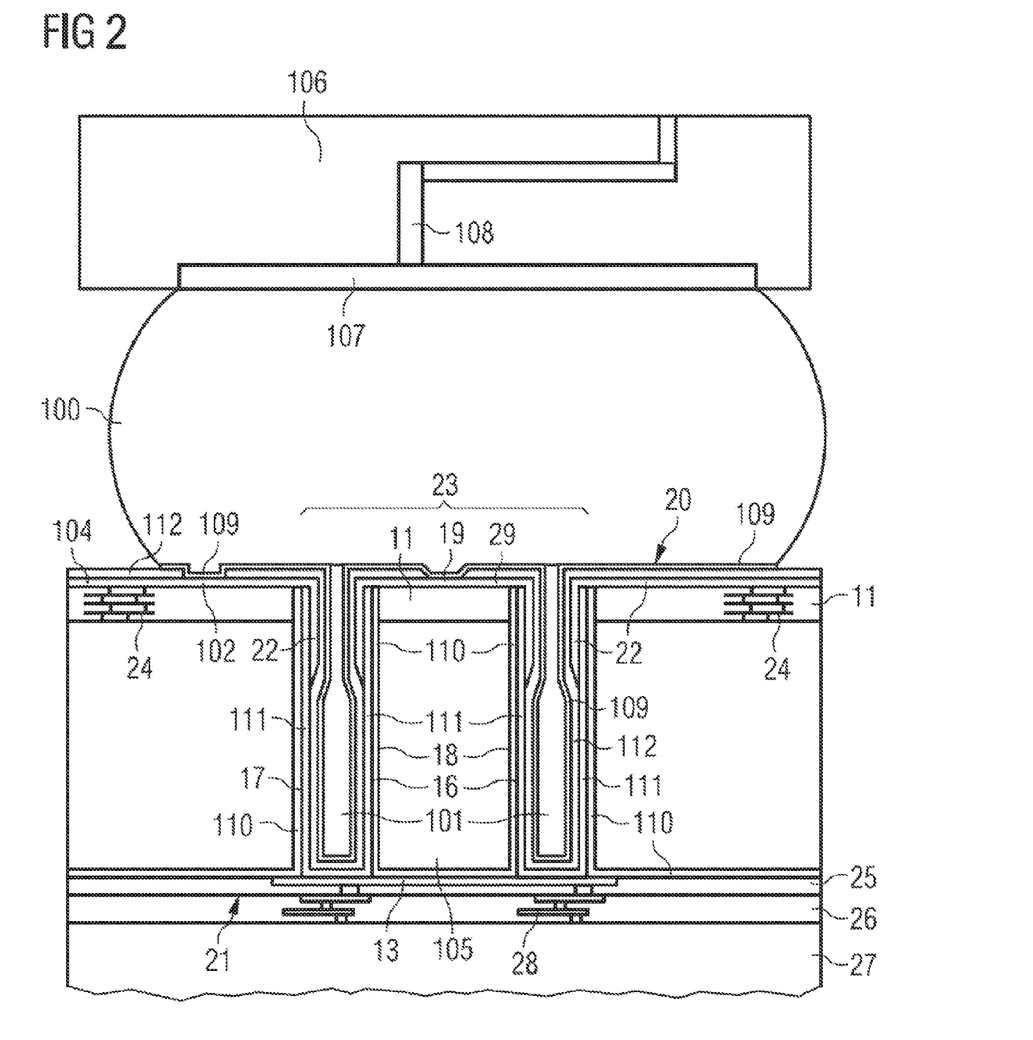
FIG. 2 shows a cross-section of a semiconductor device comprising an annular cavity, an upper terminal layer connected both to a wiring and to the solder ball, and a central via pad.

FIG. 2 shows a further example in a cross-section according to FIG. 1. The elements that are similar to the corresponding elements of the device according to FIG. 1 are designated with the same reference numerals. The device according to FIG. 2 is similar to the device according to FIG. 1 except for the arrangement of the via pad. A central upper terminal layer 29 comprising a central via pad 19 is located on the pillar 105, the portion of the substrate 10 that is surrounded by the annular cavity 18. The passivation layer 112 comprises an opening above the central via pad 19, and the solder ball 100 electrically contacts the central via pad 19. The passivation layer 112 comprises an opening above the via pad 102, and the solder ball 100 electrically contacts the via pad 102. The upper terminal layer 22 also forms an upper metal layer 104, which is connected with the wiring 24.

The arrangement of the via metallization 111 both on the inner sidewall 16, supplied with a neighboring electrical terminal, which is provided by the central via pad 19, and on the outer sidewall 17, also supplied with a neighboring electrical terminal, which is provided by the via pad 102, has the advantage of a lower resistance of the through-substrate via 23, compared to a through-substrate via without central pillar.

Figure 3:
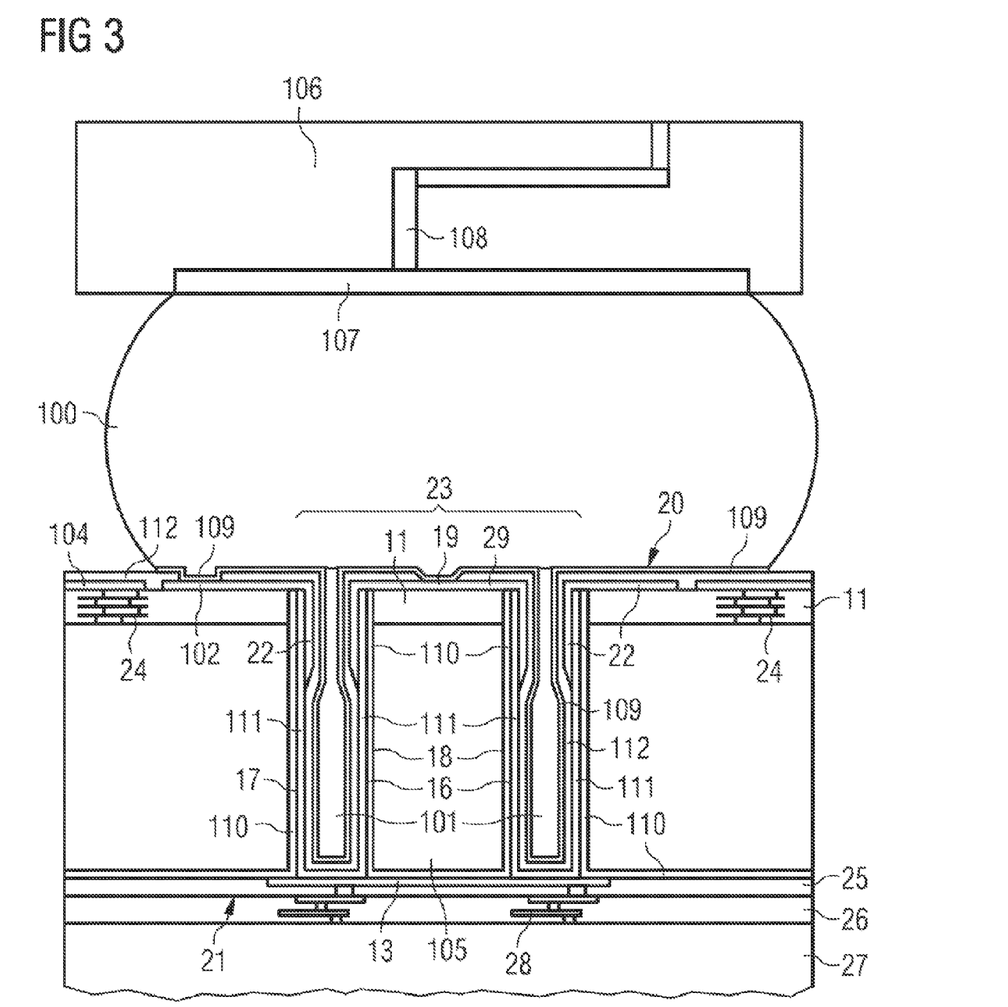
FIG. 3 shows a cross-section of a semiconductor device comprising an annular cavity, an upper terminal layer that is only connected to the solder ball, and a central via pad.

FIG. 3 shows a further example in a cross-section according to FIG. 2. The elements that are similar to the corresponding elements of the device according to FIG. 2 are designated with the same reference numerals. The device according to FIG. 3 is similar to the device according to FIG. 2 except for the upper metal layer 104 being separate from the upper terminal layer 22 comprising the via pad 102. Therefore the solder ball 100 is not connected with the upper metal layer 104, but only with the via pad 102 and the central via pad 19, thus connecting the metallization 111 only with the contact island 107 of the further substrate 106. The arrangement of the via metallization 111 on the inner sidewall 16 and on the outer sidewall 17 and of respective contacts on the upper terminal layer 22 and the central upper terminal layer 29 has the advantage of a lower resistance of the through-substrate via 23, compared to a through-substrate via without central pillar.

Figure 4:
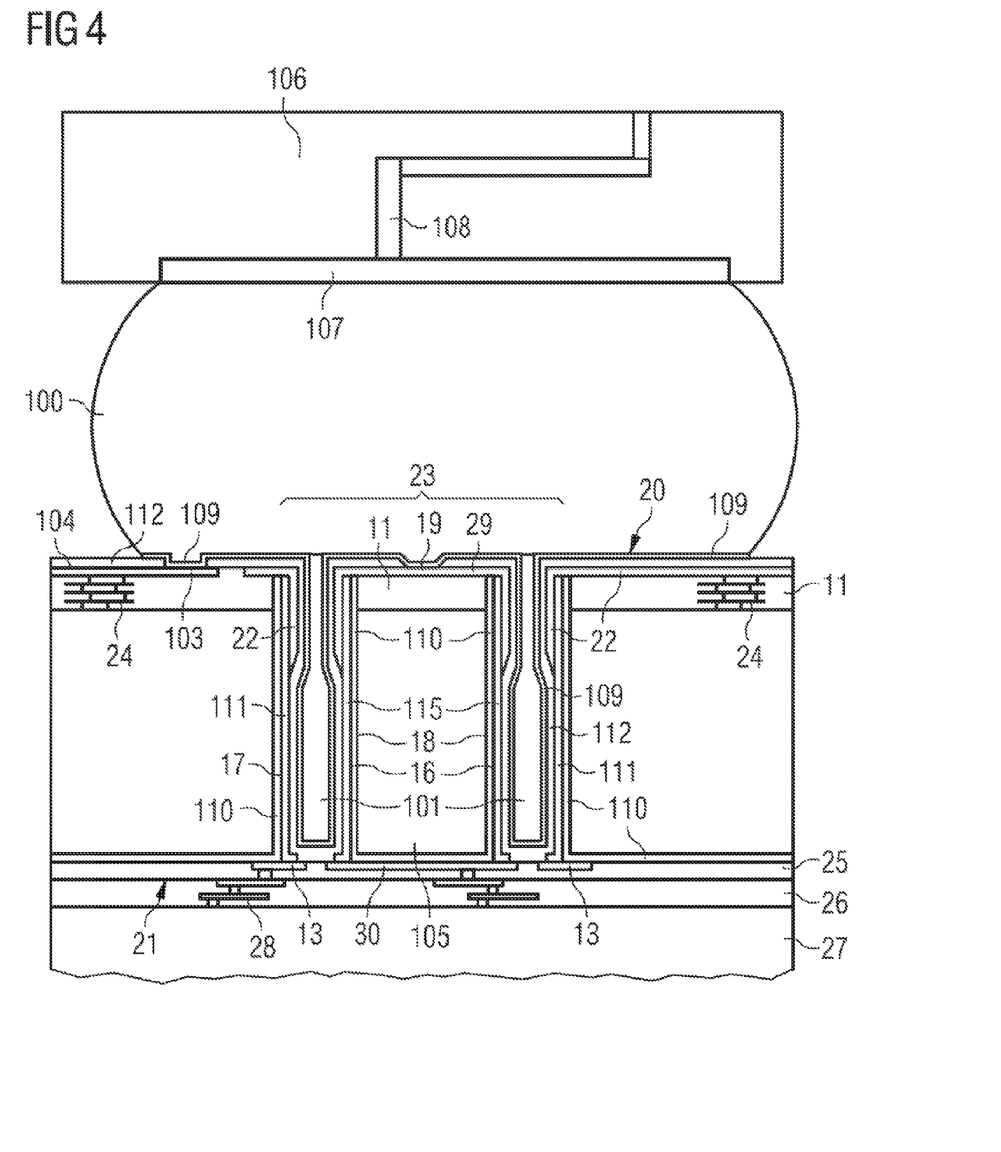
FIG. 4 shows a cross-section of a semiconductor device comprising an annular cavity with separate portions of the via metallization on sidewalls of the cavity.

FIG. 4 shows a further example in a cross-section according to FIG. 2. The elements that are similar to the corresponding elements of the device according to FIG. 2 are designated with the same reference numerals. The device according to FIG. 4 is similar to the device according to FIG. 2 except for the presence of two separate via metallizations 111, 115 and the contact of the solder ball 100 on the metal pad 103 instead of the via pad 102. An upper terminal of the through-substrate via 23 is provided by the central via pad 19, and the upper terminal layer 22 is separately connected to a part of the wiring 24, which is shown on the right side in FIG. 4. The metal pad 103 is electrically connected with the central via pad 19 only via the solder ball 100. The via metallization 111 that is arranged at the outer sidewall 17 of the annular cavity 18 is insulated from the further via metallization 115 that is arranged at the inner sidewall 16 of the annular cavity 18. The metallization 111 that is arranged at the outer sidewall 17 is electrically connected with the rear terminal layer 13. The further metallization 115 arranged at the inner sidewall 16 is electrically connected with a central rear terminal layer 30, which is arranged at the rear side 21 opposite to the central upper terminal layer 29 at the bottom of the pillar 105. The metallization 111 that is arranged at the outer sidewall 17 is surrounded by dielectric material of the insulator 110 and passivation layer 112 maintaining a floating electric potential if the metallization 111 is not electrically connected to the wiring 24 nor to the further wiring 28. In such a device the metallization 111 may therefore be used as an electrical shield or screen of the through-substrate via 23, thus rendering a through-substrate via 23 of improved isolation and low capacitance.

Figure 5:
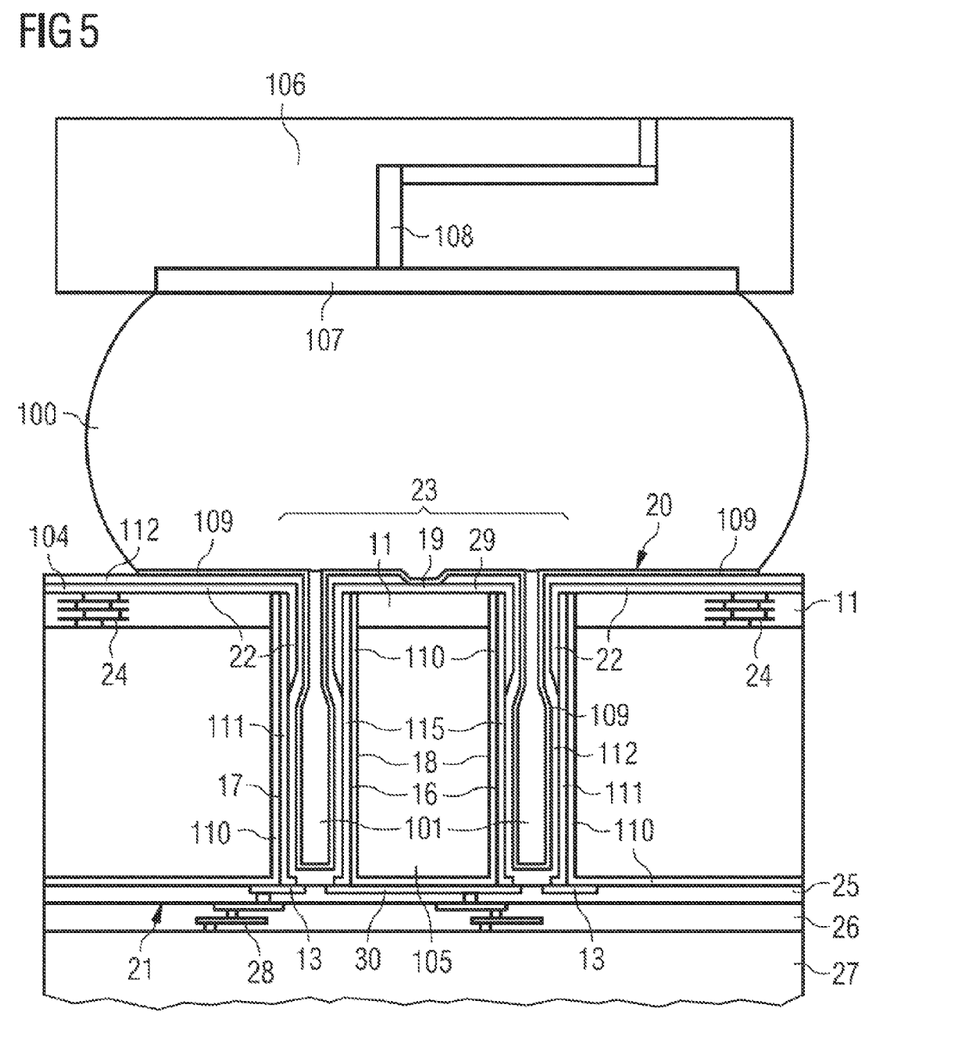
FIG. 5 shows a cross-section of a further semiconductor device according to FIG. 4.

FIG. 5 shows a further example in a cross-section according to FIG. 4. The elements that are similar to the corresponding elements of the device according to FIG. 4 are designated with the same reference numerals. The device according to FIG. 5 is similar to the device according to FIG. 4 except for an insulation between the solder ball 100 and the upper terminal layer 22. An electrical connection between the via metallization 111 that is arranged at the outer sidewall 17 of the annular cavity 18 and the wiring 24 is realized through the upper terminal layer 22. Because of the electrical connection to the wiring 24 and/or further wiring 28, the via metallization 111 that is arranged at the outer sidewall 17 may be maintained at a defined electric potential. If, instead, the metallization 111 is not electrically connected to the wiring 24 nor to the further wiring 28, the electric potential may be kept floating.

In the device according to FIG. 5, as in the device according to FIG. 4, the via metallizations 111, 115 at the inner and outer sidewalls 16, 17 can be used as separate conductors of a double, especially coaxial through-substrate via 23. The inner conductor of the double through-substrate via 23 is electrically connected to the solder ball 100, by means of the central via pad 19, and to the central rear terminal layer 30. The outer conductor of the coaxial through-substrate via 23 may be electrically connected to the upper wiring 24 and to further conductors of the further wiring 28 and device structures of the further substrate 27, which are not shown in detail.

The devices according to FIGS. 1 to 5 have the advantage that the annular cavity 18 improves electrical properties of the through-substrate via 23 and that the portion of the substrate 10 that is surrounded by the annular cavity 18 serves as a mechanical support for the solder ball 100.

In the method of producing the semiconductor device, a semiconductor substrate 10 is provided with a through-substrate via 23 which comprises a via metallization 111 provided with an upper terminal layer 22. The through-substrate via 23 is provided with an annular cavity 18, which is clad with the metallization 111, which is optionally covered by a passivation layer 112. The upper terminal layer 22 of the via metallization 111 and a metal pad 103 of an upper metal layer 104 that is separate from the upper terminal layer 22 are applied at a front side 20 of the substrate 10. To this end a metal layer may be applied so that it is electrically connected to the via metallization 111 in the opening of the through-substrate via 23. The metal layer is then structured into the upper terminal layer 22 and into a separate further section forming the upper metal layer 104 comprising the metal pad 103. A solder ball is placed on the opening of the through-substrate via 23. Then a reflow of the solder ball is effected in such a way that the solder ball 100 electrically contacts the metal pad 103 and covers the through-substrate via 23, leaving a void 101 in the through-substrate via 23.

When a through-substrate via is to be filled with electrically conductive material, capillary forces serve to draw the solder ball into the opening of the through-substrate via. This result can be avoided if the solder ball is chosen large enough to cover the whole opening of the through-substrate via 23. The air that is trapped in the void 101 prevents the solder from filling the void 101 and allows at most a small lower portion of the solder ball 100, if any, to bulge into the void 101.

In a variant of the method the reflow of the solder ball 100 is effected in such a way that the solder ball 100 electrically contacts at least one via pad 19, 102. For instance, a via pad 102 may be formed in the upper terminal layer 22, and the reflow of the solder ball 100 is effected in such a way that the solder ball 100 electrically contacts the via pad 102. The electrical contacts are improved if an under-bump metallization 109 is applied before the solder ball 100.

The use of an annular cavity 18 facilitates the support of the solder ball 100 and prevents a filling of the through-substrate via 23. A central upper terminal layer 29 may be arranged on the pillar 105 formed by the portion of the substrate 10 that is surrounded by the annular cavity 18, and a central via pad 19 may be provided in the central upper terminal layer 29. The reflow of the solder ball 100 is effected in such a way that the solder ball 100 electrically contacts the central via pad 19. In a further variant of the method separate metallizations 111, 115 are applied on sidewalls of the annular cavity 18, thereby forming a double through-substrate via 23.

We claim:

1. A method of producing a semiconductor device, comprising:
   providing a semiconductor substrate with an annular cavity extending from a front side of the substrate to an opposite rear side;
   applying a metallization in the annular cavity, thereby forming a through-substrate via and leaving an opening of the annular cavity at the front side;
   placing a solder ball above the opening; and
   effecting a reflow of the solder ball, thereby forming a void of the through-substrate via, the void being covered by the solder ball.

2. The method of claim 1, further comprising:
   arranging an electrically conductive pad at the front side of the substrate on a pillar formed by a portion of the substrate that is surrounded by the annular cavity;
   electrically connecting the pad to the metallization; and
   effecting the reflow of the solder ball in such a way that the solder ball electrically contacts the pad.

3. The method of claim 1 or 2, further comprising:
   forming the annular cavity having inner and outer sidewalls; and
   arranging the metallization on the inner sidewall and a further metallization on the outer sidewall.

4. The method of claim 3, wherein
   the metallization and the further metallization are formed separate from one another, so that a double through-substrate via is provided.

5. The method of claim 3, further comprising:
   arranging an upper terminal layer at a front side of the substrate, the upper terminal layer being electrically connected to the further metallization; and
   effecting the reflow in such a way that the solder ball electrically contacts the upper terminal layer.

6. The method of claim 5, further comprising:
   providing a metal pad that is separate from the upper terminal layer; and
   effecting the reflow in such a way that the solder ball electrically contacts the metal pad.

7. The method of claim 3, further comprising:
   arranging an upper terminal layer at a front side of the substrate, the upper terminal layer being electrically connected to the further metallization;

providing a metal pad that is separate from the upper terminal layer; and effecting the reflow in such a way that the solder ball electrically contacts the metal pad and is insulated from the upper terminal layer.

* * * * *